(12) United States Patent
Lin

(10) Patent No.: US 11,029,097 B2
(45) Date of Patent: Jun. 8, 2021

(54) HEAT DISSIPATION COMPONENT

(71) Applicant: ASIA VITAL COMPONENTS CO., LTD., New Taipei (TW)

(72) Inventor: Chih-Yeh Lin, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 1 day.

(21) Appl. No.: 16/041,830

(22) Filed: Jul. 22, 2018

(65) Prior Publication Data

US 2020/0025457 A1 Jan. 23, 2020

(51) Int. Cl.
| F28D 15/02 | (2006.01) |
| F28D 15/04 | (2006.01) |
| F28F 9/18 | (2006.01) |
| F28F 3/12 | (2006.01) |
| F28F 21/08 | (2006.01) |

(52) U.S. Cl.
CPC ....... *F28D 15/0233* (2013.01); *F28D 15/046* (2013.01); *F28F 3/12* (2013.01); *F28F 9/18* (2013.01); *F28F 21/08* (2013.01); *F28F 2255/18* (2013.01); *F28F 2275/06* (2013.01)

(58) Field of Classification Search
CPC ...... F28D 15/0233; F28D 15/046; F28F 3/12; F28F 9/18; F28F 21/08; F28F 2275/06
See application file for complete search history.

(56) References Cited

U.S. PATENT DOCUMENTS

| 2018/0087844 A1* | 3/2018 | Huang | F28F 3/12 |
| 2019/0033006 A1* | 1/2019 | Vanderwees | F28D 15/0283 |
| 2019/0113290 A1* | 4/2019 | Tseng | F28D 15/046 |

FOREIGN PATENT DOCUMENTS

| CN | 202025742 U | 11/2011 |
| CN | 102519272 B | 6/2012 |
| CN | 102595861 A | 7/2012 |
| CN | 105290402 B | 2/2016 |
| CN | 105973045 A | 9/2016 |
| CN | 106403674 B | 2/2017 |
| CN | 106941769 A | 7/2017 |
| CN | 206556483 U | 10/2017 |
| CN | 206556484 U | 10/2017 |
| CN | 207300017 U | 5/2018 |
| TW | 201403017 A | 1/2014 |
| TW | 201544221 A | 1/2014 |
| TW | M549332 U | 9/2017 |

\* cited by examiner

*Primary Examiner* — Jon T. Schermerhorn, Jr.
(74) *Attorney, Agent, or Firm* — Bradley J. Thorson; DeWitt LLP

(57) ABSTRACT

A heat dissipation component is disclosed. The heat dissipation component has a main body. The main body has a first metal plate body and a second metal plate body. The first and second metal plate bodies together define a chamber. A capillary structure layer is disposed in the chamber and a working fluid is filled in the chamber. An outer periphery of the chamber of the main body has a flange section. The flange section has a sintered welding section. The sintered welding section is perpendicularly connected with the first and second metal plate bodies. Such that, the connection and sealing of the welded first and second metal plate bodies can be enhanced.

4 Claims, 5 Drawing Sheets

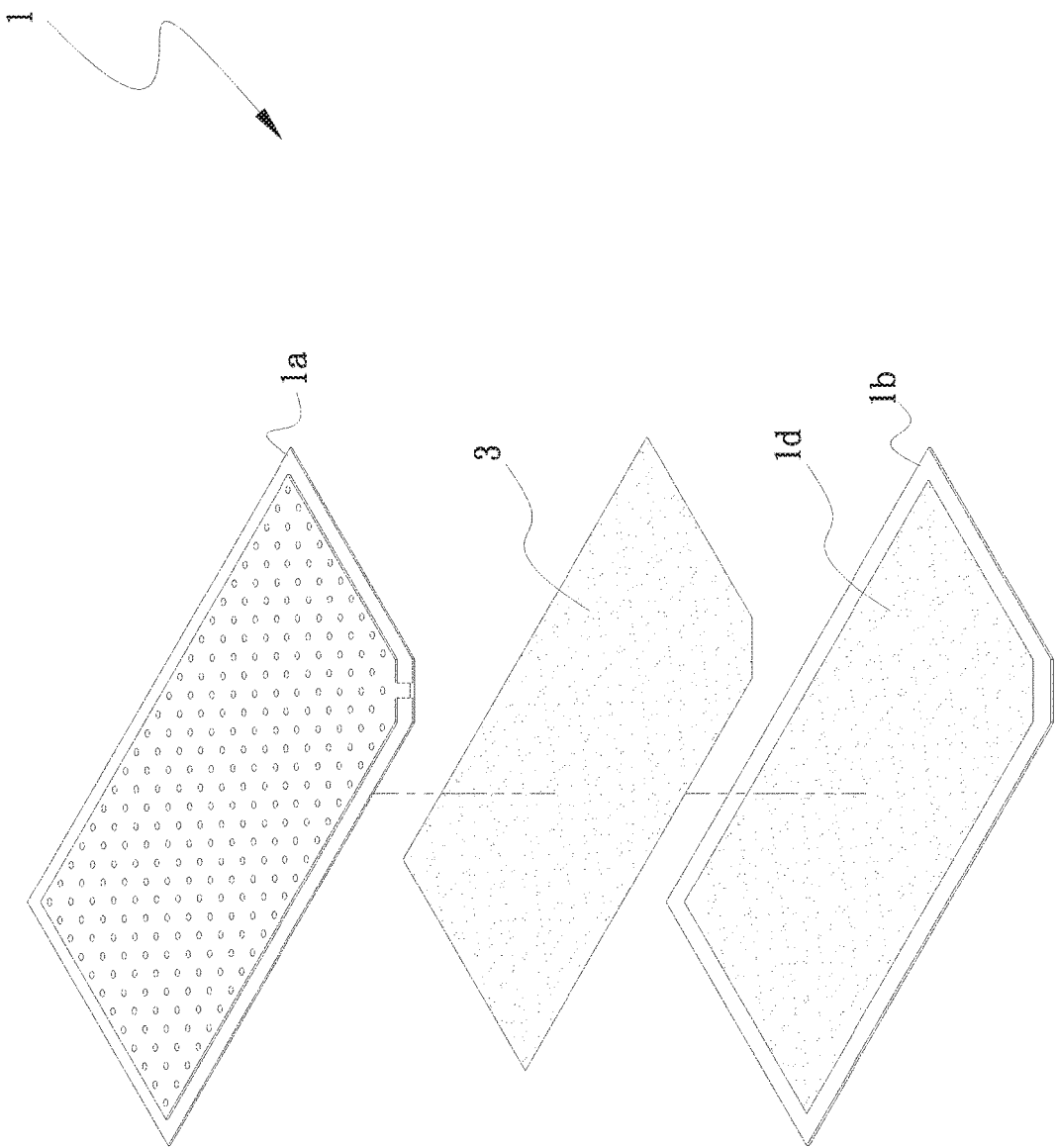

HEAT DISSIPATION COMPONENT

BACKGROUND OF THE INVENTION

1. Field of the Invention

The present invention relates generally to a heat dissipation component, and more particularly to a heat dissipation component, which can enhance the welding connection and sealing.

2. Description of the Related Art

Vapor chambers or flat-plate heat pipes are popularly used as heat conduction components. The two heat conduction components have the property of high heat conductivity. A working fluid is filled in the internal vacuum closed chamber, whereby by means of transformation between vapor phase and liquid phase, the heat can be quickly conducted. Vapor chamber and flat-plate heat pipe are formed in such a manner that at least two metal plate bodies, that is, an upper metal plate body and a lower metal plate body, are overlapped and then the periphery is sealed and then the chamber is vacuumed and then the working fluid is filled into the chamber. Finally, the water-filling and air-sucking section is sealed to form the vapor chamber and flat-plate heat pipe. The vapor chamber and flat-plate heat pipe are generally made of metal material such as copper, aluminum, stainless steel, etc. and most generally made of copper. This is because copper has the property of high heat conductivity.

Most of the vapor chambers and flat-plate heat pipes mainly employ diffusion bonding and brazing and point welding to seal the periphery. The diffusion bonding and brazing are applicable to most of the materials. However, in case two different kinds of materials such as copper and aluminum or copper and stainless steel are to be connected, the bonding diffusion method is not applicable to the materials.

The point welding has a shortcoming that the processing can be continuously performed but the periphery cannot be fully sealed. In case point welding is applied to the sealing work of the vapor chamber, the vacuum degree of the internal chamber can be hardly maintained. Also, due to poor sealing, the working fluid is apt to leak out to lose the heat conduction effect.

Some manufacturers use fillet welding method to weld and connect the metal plate bodies. In the current fillet welding method, the vapor chamber or the flat-plate heat pipe is mainly composed of an upper plate 3a (with smaller surface area) and a lower plate 3b (with larger surface area). The upper and lower plates 3a, 3b are overlapped and then the fillet welding is performed in the right angle corners of the overlapped upper and lower plates 3a, 3b (as shown in FIGS. 1 and 1a). The upper and lower plates 3a, 3b with different sizes can be welded and connected by means of fillet welding. However, the conventional fillet welding method and the connected sections of the materials still have some shortcomings. For example, in order to form the right angle corners of the upper and lower plates 3a, 3b for the fillet welding, the upper plate 3a is selectively smaller than the lower plate 3b. Therefore, the upper and lower plates 3a, 3b must be precisely located and aligned with each other even with an exclusive tool.

Furthermore, when the welding path of the fillet welding encounters a round angle, the path must be gradually modified from a straight line to an arched path. In this case, generally multiple short straight lines will be adopted to assemble into an arched path. Under such circumstance, the fillet welded sections will overlap or the staying time will be prolonged. This often leads to over-melting of the material or even damage of the capillary structure inside the vapor chamber or the flat-plate heat pipe or contraction of the internal chamber. In addition, in order to form the right angle corners for the fillet welding, the upper and lower plates 3a, 3b must have different configurations and sizes. In this case, the outer periphery of the lower plate 3b is apt to form redundant and void flange. This leads to waste of material.

In conclusion, the conventional vapor chamber or flat-plate heat pipe has the following shortcomings:
1. The material is wasted.
2. The sealing is poor.
3. It is necessary to additionally locate the upper and lower plates.
4. The different materials are hard to connect with each other.

SUMMARY OF THE INVENTION

It is therefore a primary object of the present invention to provide a heat dissipation component having better connection and sealing.

To achieve the above object, the heat dissipation component of the present invention includes a main body.

The main body has a first metal plate body and a second metal plate body. The first and second metal plate bodies together define a chamber. The surface of the chamber has at least one capillary structure layer and a working fluid is filled in the chamber. An outer periphery of the chamber of the main body has a flange section. The flange section has a sintered welding section. The sintered welding section perpendicularly connects the first and second metal plate bodies.

The present invention improves the fillet welding angle structure of the first and second metal plate bodies and the fillet welding method so as to enhance the connection and sealing of the vapor chamber.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 4 is a perspective exploded view of a second embodiment of the heat dissipation component of the present invention.

DETAILED DESCRIPTION OF THE PREFERRED EMBODIMENTS

Figure 1:
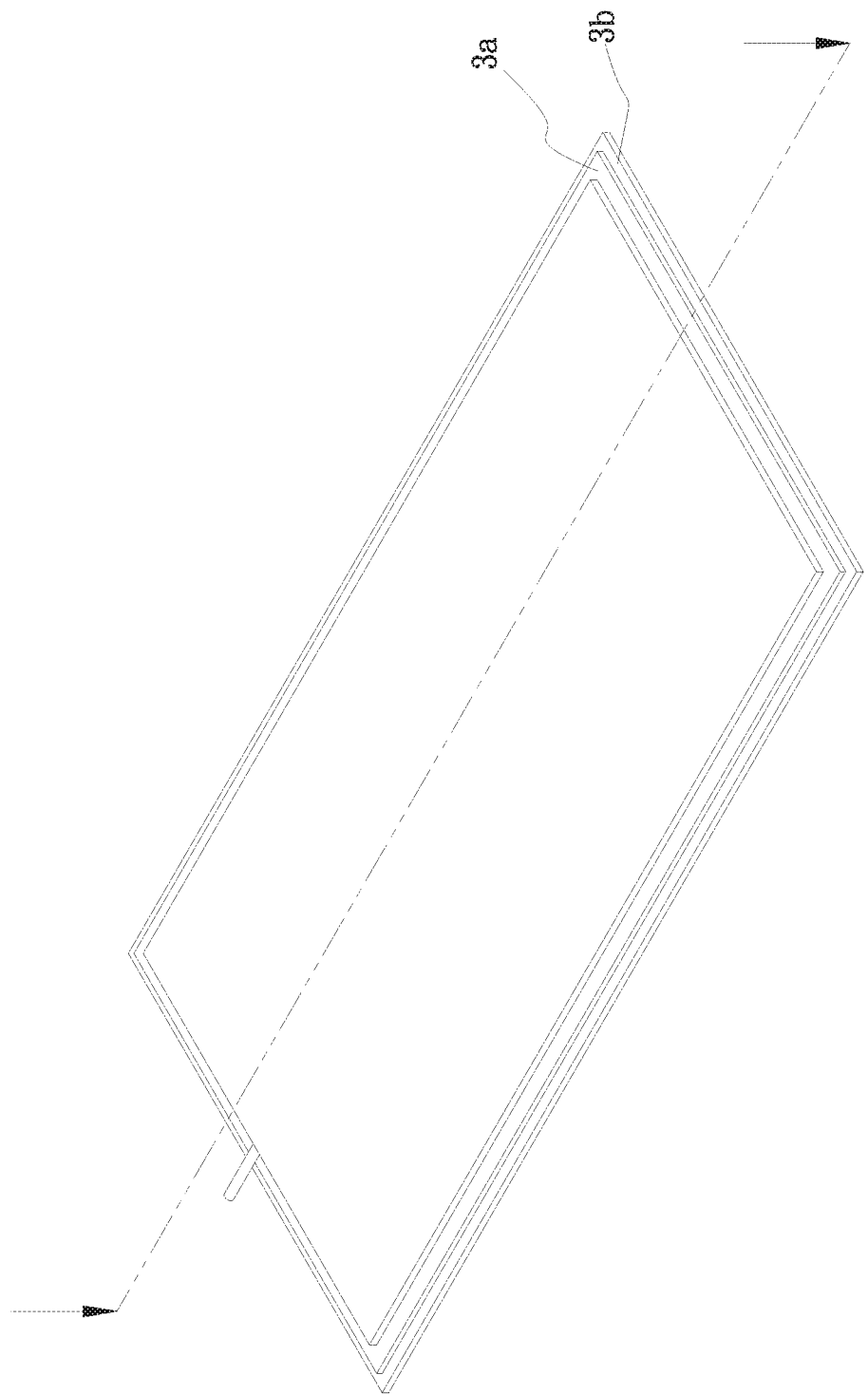
FIG. 1 is a perspective view of a conventional vapor chamber.
Figure 1A:
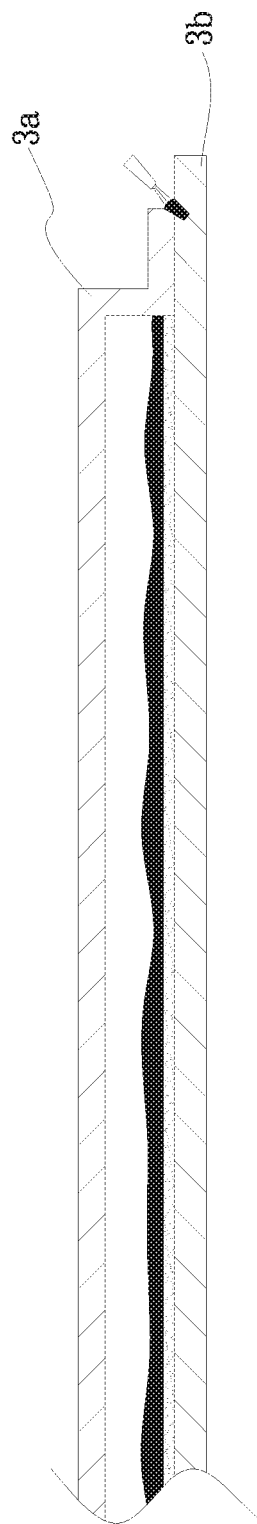
FIG. 1a is a sectional view of the conventional vapor chamber.
Figure 2:
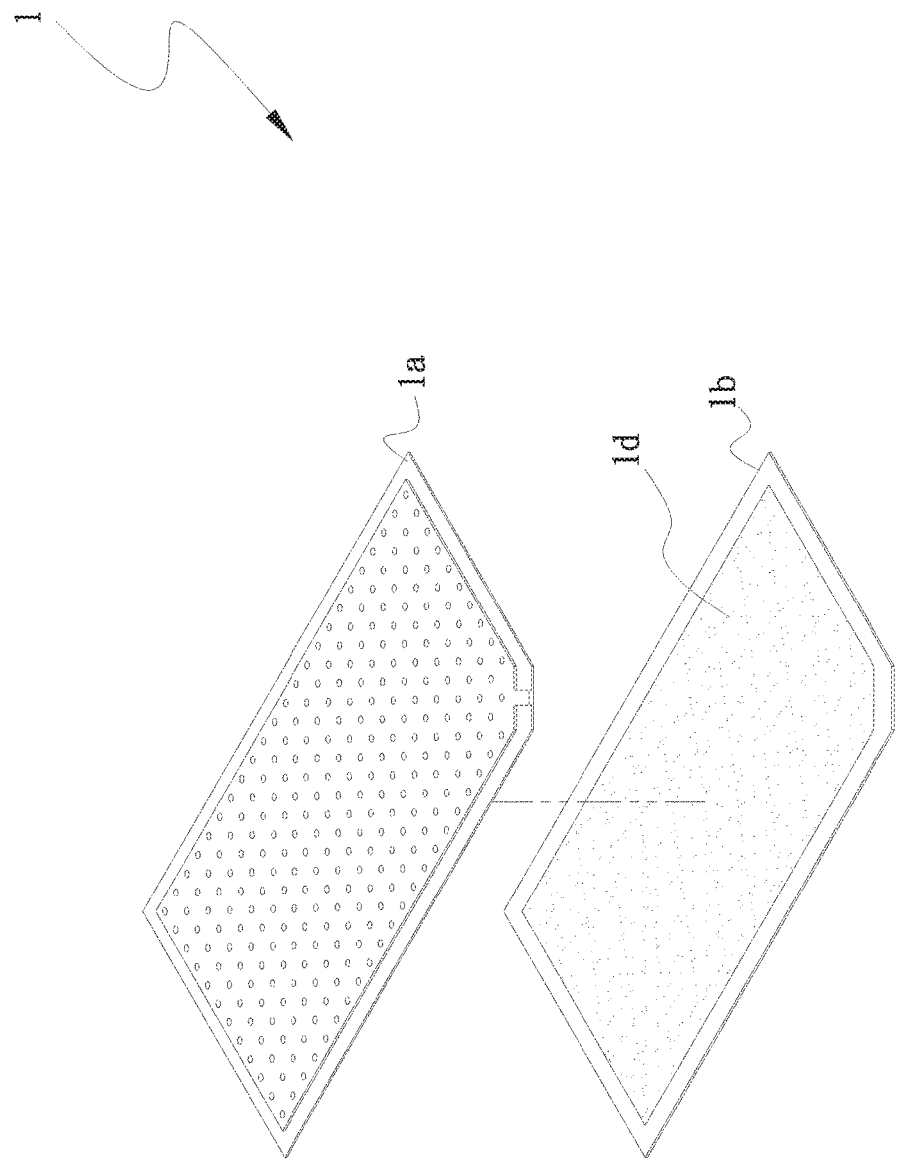
FIG. 2 is a perspective exploded view of a first embodiment of the heat dissipation component of the present invention.
Figure 3:
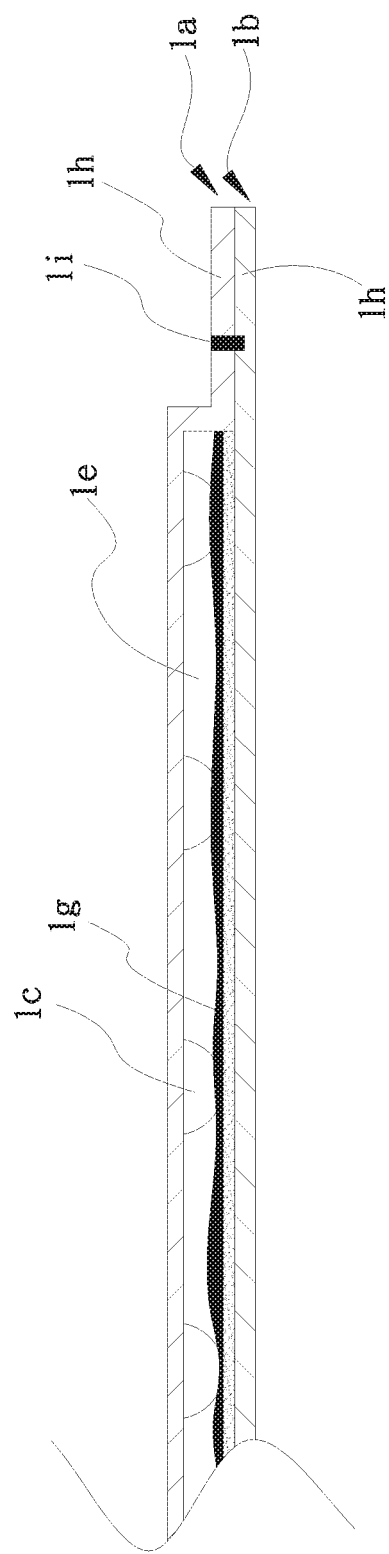
FIG. 3 is a sectional view of the first embodiment of the heat dissipation component of the present invention.

Please refer to FIGS. 2 and 3. FIG. 2 is a perspective exploded view of a first embodiment of the heat dissipation component of the present invention. FIG. 3 is a sectional view of the first embodiment of the heat dissipation component of the present invention. According to the first embodiment, the heat dissipation component of the present invention includes a main body 1.

The main body 1 has a first metal plate body 1a and a second metal plate body 1b. The first and second metal plate bodies 1a, 1b are made of a material selected from a group consisting of gold, silver, iron, copper, aluminum, commercial pure titanium, stainless steel and any other heat conduction metal. The first and second metal plate bodies 1a, 1b together define a closed chamber 1e. The surface of the closed chamber 1e has at least one capillary structure 1d, (which can be a sintered powder body, a fiber body, a mesh body or a channeled body). The capillary structure 1d is selectively disposed on one of the first and second metal plate bodies 1a, 1b. A working fluid 1g is filled in the closed chamber 1e. An outer periphery of the closed chamber 1e of the main body 1 has a flange section 1h. The flange section 1h has a sintered welding section 1i. The sintered welding section 1i is perpendicularly connected with the first and second metal plate bodies 1a, 1b. The sintered welding section 1i perpendicularly penetrates through the entire plate thickness of the first metal plate body 1a and extends to a position of one-third to two-third the plate thickness of the second metal plate body 1b.

The main body 1 has a support structure 1c. The support structure 1c is formed by means of external force deformation or cutting processing or externally added component as a support member. The cutting processing is such that one side of one of the first and second metal plate bodies 1a, 1b is selectively cut and processed (such as milled and processed) to form raised structures abutting against and supporting the other plate body. The support structure 1c formed by means of external force deformation is such that an external force is selectively applied to one side of one of the first and second metal plate bodies 1a, 1b to be recessed toward the other side so as to form the support structure 1c. The externally added component is, but not limited to, such that a support body such as a support column is disposed between the first and second metal plate bodies 1a, 1b as the support structure 1c.

Please now refer to FIG. 4, which is a perspective exploded view of a second embodiment of the heat dissipation component of the present invention. The second embodiment is partially identical to the first embodiment and thus will not be redundantly described hereinafter. The second embodiment is different from the first embodiment in that a capillary structure member 3 is disposed between the first and second metal plate bodies. In this embodiment, the capillary structure member is one single structure body. The capillary structure member 3 is disposed between the first and second metal plate bodies 1a, 1b. The capillary structure member 3 is a sintered powder plate body, a fiber body, a mesh body, a waved plate or a plate body with multiple channels. The capillary structure member 3 serves to provide assistant capillary attraction so as to enhance the vapor-liquid circulation efficiency.

The present invention employs fillet welding to improve the shortcoming of the conventional device that the commercial pure titanium or titanium metal or copper material is uneasy to connect. Also, the present invention is advantageous over the conventional device that in the fillet welding process, the fillet welder is positioned normal to the first and second metal plate bodies 1a, 1b to be fillet welded. Accordingly, the discharging molten material produced by the fillet welder perpendicularly penetrates through the first metal plate body 1a and penetrates into the second metal plate body 1b by one-third to two-third the thickness of the second metal plate body 1b so as to finally completely connect the first and second metal plate bodies 1a, 1b and enhance the connection and sealing of the first and second metal plate bodies 1a, 1b. Moreover, the present invention improves the shortcoming of the conventional vapor chamber or flat-plate heat pipe that it is uneasy to align.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation component comprising a main body, the main body having a first metal plate body and a second metal plate body, the first and second metal plate bodies being made from titanium or titanium alloy and together defining a closed chamber, a surface of the closed chamber having at least one capillary structure layer, a separate capillary structure member being disposed between the first and second metal plate bodies, a working fluid being filled in the closed chamber, an outer periphery of the closed chamber of the main body having a flange section, the flange section having a sintered welding section, the sintered welding section being perpendicularly connected with the first and second metal plate bodies by fillet welding.

2. The heat dissipation component as claimed in claim 1, wherein the sintered welding section perpendicularly penetrates through the entire plate thickness of the first metal plate body and extends to a position of one-third to two-third the plate thickness of the second metal plate body.

3. The heat dissipation component as claimed in claim 1, wherein the main body has a support structure, the support structure being formed by means of external force deformation or cutting processing or externally added component as a support member, the cutting processing being such that one side of one of the first and second metal plate bodies is selectively cut to form raised structures abutting against and supporting the other plate body, the support structure formed by means of external force deformation being such that an external force is selectively applied to one side of one of the first and second metal plate bodies to be recessed toward the other side so as to form the support structure, the externally added component being such that a support body such as a support column is disposed between the first and second metal plate bodies as the support structure.

4. The heat dissipation component as claimed in claim 1, wherein the capillary structure member is a sintered powder plate body, a fiber body, a mesh body, a waved plate or a plate body with multiple channels.

* * * * *